US007078153B2

(12) United States Patent
Hotta

(10) Patent No.: US 7,078,153 B2
(45) Date of Patent: Jul. 18, 2006

(54) PLANOGRAPHIC PRINTING PLATE

(75) Inventor: Hisashi Hotta, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/826,888

(22) Filed: Apr. 6, 2001

(65) Prior Publication Data

US 2002/0039702 A1 Apr. 4, 2002

(30) Foreign Application Priority Data

Apr. 7, 2000 (JP) ............................. 2000-106078
May 9, 2000 (JP) ............................. 2000-135490

(51) Int. Cl.
*G03F 7/11* (2006.01)

(52) U.S. Cl. ............................... 430/278.1; 430/272.1; 430/302; 430/944; 430/945

(58) Field of Classification Search ............ 430/272.1, 430/278.1
See application file for complete search history.

(56) References Cited

U.S. PATENT DOCUMENTS

| | | | | |
|---|---|---|---|---|
| 5,569,573 | A * | 10/1996 | Takahashi et al. | 430/138 |
| 5,633,115 | A | 5/1997 | Jaeger et al. | |
| 5,658,708 | A | 8/1997 | Kondo | |

FOREIGN PATENT DOCUMENTS

| | | |
|---|---|---|
| EP | 0 316 240 A1 | 5/1989 |
| EP | 0 341 825 A2 | 11/1989 |
| EP | 0 697 282 A1 | 2/1996 |
| EP | 0 716 935 A1 | 6/1996 |
| EP | 0 730 202 A2 | 9/1996 |
| WO | WO98/52743 | 11/1998 |

* cited by examiner

*Primary Examiner*—Cynthia Hamilton
(74) *Attorney, Agent, or Firm*—Buchanan Ingersoll PC

(57) ABSTRACT

The present invention provides a thermal type planographic printing plate which is writable by infrared laser beam exposure, can record images with high sensitivity and can provide a high quality printed matter which does not have stains. The planographic printing plate comprises a recording layer which is writable by infrared-laser exposure on a support formed with an anodic oxidation coating having a predetermined density and/or vacancy ratio on a roughened surface of an aluminum substrate.

12 Claims, 2 Drawing Sheets

PLANOGRAPHIC PRINTING PLATE

BACKGROUND OF THE INVENTION

1. Field of Invention

The present invention relates to a planographic printing plate, and particularly to a planographic printing plate having a heat sensitive recording layer of heat-mode type, wherein recording is performed using heat generated by means of photothermal conversion of a laser beam into heat.

2. Description of the Related Art

Recently, in accordance with progress in image recording technology, much attention is being directed to a technique in which a printing plate is formed directly without using a film original. In this technique a printing plate is scanned by a finely focused laser beam and characters and images are directly formed on the plate.

One of the examples of image recording materials in this field is what is called thermal type positive planographic printing plate. In this type of plate, an infrared absorbing agent in the photosensitive layer, by photothermal conversion action, generates heat by exposure and the generated heat causes exposed portion of the photosensitive layer to become soluble, resulting in formation of a positive image. Another example is a thermal type negative planographic printing plate. In this type of plate, firstly, the heat generated causes an acid to be formed by an acid generator or a radical to be formed by a radical generator. The acid or radical generated accelerates a radical polymerization reaction or an acid cross-linking reaction thereby forming insoluble portions and resulting in formation of negative images.

In the thermal type image recording process of this kind, photothermal conversion materials in the photosensitive layer generate heat due to laser light irradiation. The heat generated causes an image recording reaction. However on a roughened surface of an aluminum support with anodic oxide coating, because the thermal conductivity of the support is extremely high compared to that of the photosensitive layer, the heat generated in the vicinity of the interface of the support of the photosensitive layer diffuses to the inside of the support before being sufficiently used for image recording. Consequently, the decomposition reaction of positive photosensitive layer at the interface of the support of the photosensitive layer is insufficient. Consequently a residual film is formed in portions that should have been non-image portion causing the fundamental e problem of low sensitivity.

In order to deal with this problem, a variety of basecoats are being studied in order to improve developing property of the photosensitive layer in the vicinity of the interface of the support in positive type photosensitive layers. Also, for negative layers some experiments are being carried out in which the exposed parts are forced to be hardened by after-heating, or in which the surface of the layer is hardened easily by adjusting the photosensitive layer. Neither of the above mentioned experimentation was able to obtain satisfactory result.

Other methods being tried include using organic materials having low thermal conductivity for the support or the intermediate layer. However in this case, although insulative property is improved, the support is not appropriate for practical usage because adhesion with the recording layer is poor a non image portion of the layer has poor hydrophilic property.

Particularly in the recent market, there has been a strong demand to cut down exposure time in order to improve productivity and to extend the life of a laser by use at as low a power as possible. A planographic printing plate has been required which can be made directly using a laser beam; which uses the generated heat efficiently for an image recording reaction, whose non-image portion has excellent solubility in an acrylic developing solution; which has high sensitivity; and wherein a non image portion is not stained due to residual film formation.

The object of the present invention, therefore, is to provide a thermal type planographic printing plate which is writable due to infrared laser beam exposure, has high sensitivity and provides high quality printed matter which does not have stains.

SUMMARY OF THE INVENTION

As a result of research by the inventors of the present invention an effort to achieve the above mentioned object, it was found that the above-mentioned defects could be overcome by forming an inorganic film on the surface of an aluminum substrate having both low density and high insulative property. This finding led to the present invention.

The present invention provides a planographic printing plate having a recording layer which is writable by infrared-laser exposure, said recording layer being provided on a support formed of an inorganic oxidation coating on a roughened surface of an aluminum substrate, wherein the density of said inorganic oxidation coating is from 1000 through 3200 kilograms/$m^3$. The inorganic oxidation coating can be an anodic oxidation coating.

In another aspect, the present invention provides a planographic printing plate having a recording layer which is writable by infrared-laser exposure, said recording layer being provided on a support formed of an anodic oxidation coating on a roughened surface of an aluminum substrate, and satisfying at least one of the following conditions (i) and (ii):

(i) density of the anodic oxidation coating is from 1000 through 3200 kilograms/$m^3$, or (ii) vacancy ratio defined in the following equation is in the range from 20 percent through 70 percent, diameter of a micropores (vacancies) of the anodic oxidation coating which are exposed on the surface is not more than 15 nanometer and a contact angle of a non-image area after a developing process is not more than 20 degrees:

$$\text{vacancy ratio (percent)}=(1-(\text{density of anodic oxide coating}/3.98))\times 100$$

wherein density of an anodic oxidation coating (gram/$cm^3$)=weight of an anodic oxidation coating per unit area/thickness of the anodic oxide coating.

As examples of infrared-laser writable recording layers formed on the planographic printing plate, the following two types of layers are preferable; the first example is a negative recording layer comprising compounds that release an acid or radical due to the effect of an infrared absorbing agent or due to heat, and compounds that form cross links or polymerize due to the effect of an acid or radical; the second is a positive recording layer comprising compounds that become soluble in, for example, alkaline aqueous solutions due to decomposition of bonding structure due to infrared absorbing agents and heat.

The mechanism of the present invention is not yet clear, but it is supposed that higher sensitivity is obtained because the thermal conductivity at the interface of the support of the photosensitive layer is decreased by forming the inorganic layer (anodic oxide coating) having specific properties. An example is a thermal insulator formed on the substrate of aluminum (alloy) having the above-mentioned specific properties. Sensitivity may be increased when a sealing process is carried out such that only the surface of anodic oxidation coating is sealed and the opening in the inner portion remain.

In a preferred embodiment of the present invention, by further blocking the portion of the coating surface which has vacancies by subjecting said coating surface to a sealing process, a layer formed of a low density coating which holds air inside is formed, and thus a further increase in sensitivity is achieved. A support having this structure is also advantageous since formation of a residue film of the lipophilic compositions such as the dyes and binders and the like in the photosensitive layer is effectively prevented. Another advantage is the penetration of ink into the vacancies at the time of printing is controlled thus staining is suitably prevented. If the features of (ii) particularly are included, the contact angle of the exposed non image portion after the developing process is kept at not more than 20 degree because of the existence of the anodic oxide coating. Accordingly staining of the non image portion is efficiently prevented since the surface of the portion has hydrophilic and ink repelling properties, and thus formation of image with high quality is performed. Moreover, a micropore (vacancy) having predetermined shape and a predetermined diameter is obtained by treating the anodic oxidation coating with acid or alkali, thus further increasing sensitivity and hydrophilic property. This process may be combined with sealing the anodic oxidation coating to obtain a micropore (vacancy) with having a predetermined shape and a predetermined diameter. A support of this type is able to provide both high sensitivity because of superior thermal insulative property and to effectively prevent a residual film of dye and/or binder in photosensitive layer from forming, and moreover anti-staining property is increased because of the increased hydrophilic property.

DETAILED DESCRIPTION OF THE DRAWINGS

DETAILED DESCRIPTION OF THE PREFERRED EMBODIMENTS

Figure 1:
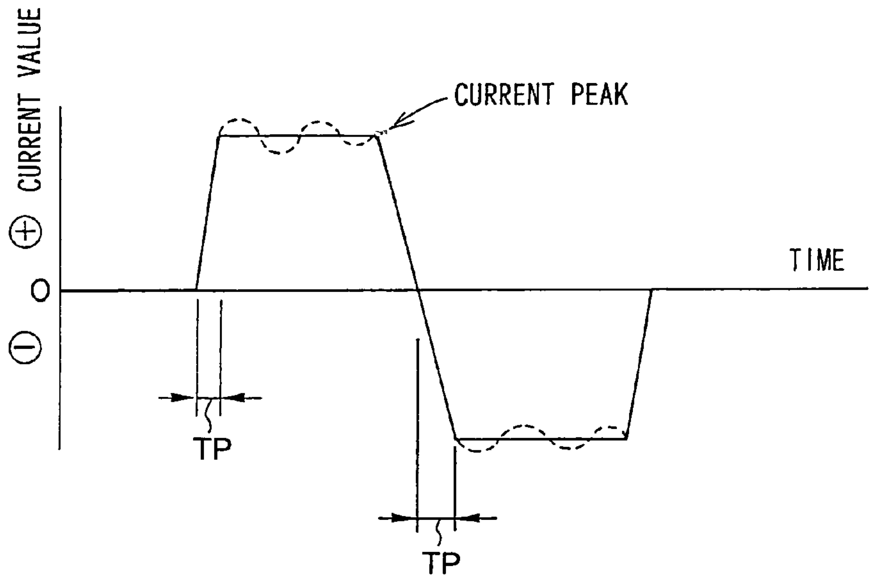
FIG. 1 is a part of graph showing one example of wave form of alternate wave current used in the process of electrochemical roughening of an aluminum support for a planographic printing plate in the present invention.

The present invention is described in detail hereinafter.

Support

The support used in the present invention has anodic oxidation coating having a predetermined low density and/or a predetermined vacancy ratio and micropores (vacancies) having a predetermined diameter on roughened surface of aluminum substrate. The present invention consists of forming anodic oxidation coating on roughened aluminum substrate, such that at least one of the following (i) and (ii)is satisfied.

(i) density of the anodic oxidation coating is from 1000 through 3200 kilograms/meter$^3$; or (ii) the vacancy ratio represented in the following equation is in the range of 20 through 70 percent, the diameter of the micropore (vacancy) in the anodic oxidation coating on the surface of the layer is not more than 15 nanometer and the contact angle of the non image portion after developing process is not more than 20 degrees.

$$\text{vacancy ratio (percent)}=(1-(\text{density of anodic oxide coating})/3.98)\times 100$$

wherein density of anodic oxidation coating (gram/centimeter$^3$)=(weight of anodic oxidation coating per unit area)/(thickness of anodic oxide coating)

Aluminum Substrate

An aluminum substrate forming a substrate of the support comprises metals having dimensional stability such as those having aluminum as a main component. That is aluminum or aluminum alloys may be used. In the present invention the term "aluminum substrate" when used hereinafter includes, in addition to a pure aluminum plate which inevitable which inevitably has impurities, an alloy metal plate composed of mainly aluminum and of a little small amount of other elements, or plastic film or paper onto which aluminum was laminated or evaporated.

And moreover, as aluminum substrate of the present invention, a composite sheet of a poly-ethylene-terephthalate film laminated with an aluminum sheet as disclosed in Japanese Patent Application Publication No. 48-18327 can be used.

Hereinafter, "aluminum substrate" is used as general name for a substrate comprising aluminum or an aluminum alloy. Examples of other elements included in the aluminum alloy mentioned above include silicon, ferrum, manganese, copper, magnesium, chrome, spelter, bismuth, nickel and titanium. The content of other elements in the alloy must be not more than 10 percent by weight. A pure aluminum plate is preferably used in the present invention. However, aluminum including a small amount of other elements is acceptable because it is difficult to produce perfectly pure aluminum by the present refining techniques.

As described above, the composition of the aluminum plate used as the substrate in the present invention is not strictly specified and conventional materials may be used as required. The thickness of the aluminum substrate used in the present invention is from about 0.1 millimeter through 0.6 millimeter. This thickness can be changed according to the dimension of the printing machine, the size of the printing plate or the desire of users.

Roughening Process of Substrate

Graining Process

Aluminum plate is granulated to obtain a preferable granulated surface. In the graining process there can be used a mechanical process, a chemical etching process and an electrolysis graining process as described in Japanese Patent Application Laid-Open No. 56-28893. Moreover, other examples of graining processes are as follows; an electrochemical graining process wherein graining is performed by electrochemical treatment in an electrolyte solution with hydrochloric acid or nitric acid, a mechanical graining process such as a wire-brush graining process wherein the surface of an aluminum plate is brushed by metallic wire, a ball graining process wherein the surface of an aluminum plate is granulated by grinders and abrasive powders and a brush graining process wherein the surface is granulated by nylon brush and abrasive powders. The above mentioned process can be used separately or two or more processes can be used in combination.

The graining process useful in the present invention is the electrochemical process wherein graining is performed in an electrolyte solution with hydrochloric acid or nitric acid. The suitable amount of electric current density is in the range of 50 $C/dm^2$ through 400 $C/dm^2$ of anode-time electricity. More practically, the process is performed using AC or DC in an electrolyte solution containing 1 to 50 percent of hydrochloric acid or nitric acid, at a temperature of 20 degrees through 100 degrees Celsius, for 1 second through 30 minutes, an at electric current density of 100 $C/dm^2$ through 400 $C/dm^2$. This electrochemical roughening process can easily provide a fine concave-convex surface and cannot be omitted if adhesive power between photosensitive layer and substrate is to be increased.

Craters or honeycomb shaped pits with an average diameter of 0.5 mircrometer through 20 micrometer are provided on the surface of aluminum in an area ratio of 30 percent through 100 percent. The pits formed here have a function of increasing anti-staining property in non image portion and increasing durability in printing.

In the electrochemical roughening treatment, in order to form a sufficient number of pits, it is important to utilize just the necessary amount of electricity. This means that the product of amount of current and period of current flow is an important factor for the electrochemical roughening process. It is at the same time desirable in light of energy conservation to obtain a sufficient number of pits and use less electricity. The surface roughness after the roughening process is preferably of Ra=0.2 micrometer through 0.7 micrometer.

Etching Process

The substrate granulated as described above is then chemically etched with acids or alkalis. When acids are used as an etching agent it takes a comparably long period to decompose the micro structure, and accordingly it is disadvantageous in industrial use of the present invention. However, etching efficiency is improved by using alkalis as an etching reagent. Examples of alkalis preferably used in the present invention are as follows; sodium hydroxide, sodium carbonate, sodium aluminate, sodium metasilicate, sodium phosphate, potassium hydroxide and lithium hydroxide. It is preferable that conditions are set such that the solubility of aluminum is in the range of 5 through 20 $grams/m^3$, and specifically, the concentration of alkalis is in the range of 1 percent through 50 percent, and of temperature is in the range of 20 degrees Celsius through 100 degrees Celsius. The etched aluminum substrate is washed with acid to remove smut remaining on the surface. Acids are selected from the group of nitric acid, sulfuric acid, phosphoric acid, chromic acid, hydrofluoric acid and fluoroboric acid. Examples of a method for smut removing after the electrochemical roughening preferably include a method putting the substrate in contact with 15 percent through 65 percent aqueous solution of sulfuric acid at a temperature of 50 degrees Celsius through 90 degrees Celsius as described in JP-A 53-12739, and method of alkali etching as described in JP-B 48-28123.

Inorganic Layer (Anodic Oxide Coating) Forming Process

Anodic oxide coating process is then performed to form a coating with low density and with excellent thermal insulative property on the aluminum substrate treated as described above. It is possible to form a micropore with vacancies of a predetermined dimension by selecting proper anodic oxidation conditions in this process. A coating with a desired low density is easily obtained by controlling the conditions of anodic oxidation, after treating and accordingly controlling the dimensions of micropores.

The anodic oxidation can be performed using known conventional methods. Specifically anodic oxidation coating is formed on the surface of the aluminum support by the method in which AC or DC current is applied to the aluminum support in an aqueous or non-aqueous solution of a single acid or a combination of acid(s) selected from sulfuric acid, phosphoric acid, chromic acid, oxalic acid, sulfamic acid and benzene sulfonic acid.

The electrolyte used in the process may contain elements naturally contained in an aluminum alloy, an electrode, running water and groundwater. Moreover, a second and/or third component may be added to the electrolyte. Example of the second and/or the third component include: metallic ions of Na, K, Mg, Li, Ca, Ti, Al, V, Cr, Mn, Fe, Co, Ni, Zn; cationic ions such as ammonium ion; anionic ions such as nitrate ion, carbonate ion, chloric ion, phosphate ion, fluoric ion, sulfite ion, titanic ion, silicate ion and boric ion. The concentration range may be 0 through 10000 ppm.

The conditions of anodic oxidation cannot be unconditionally determined because it highly depends on the composition of electrolyte used. However generally the following conditions are preferable; electrolyte concentration of 1 percent through 80 percent, electrolyte temperature of −5 degrees Celsius through 70 degrees Celsius, current density of 0.5 $A/dm^2$ through 60 $A/dm^2$, voltage of 1 volt through 100 volts and electrolysis period of 10 seconds through 200 seconds. Of in the conditions mentioned above, a method of using sulfuric acid and a method of using high current density as described in British Patent No. 1,412,768 is particularly preferable. In the present invention it is preferable that the weight of the anodic oxidation coating is in the range of 0.5 $g/m^2$ through 20 $g/m^2$. If the weight is not more than 0.5 $g/m^2$ the plate may damage easily. If the weight is more than 20 $g/m^3$, large amounts of power is required for its production, and this is economically disadvantageous. Preferably the weight of the anodic oxidation coating is in the range of 1.0 $g/m^2$ through 10 $g/m^2$, and more preferably in the range of 1.5 $g/m^2$ through 6 $g/m^2$.

Especially in condition (ii) of the present invention, the anodic oxidation coating is preferably formed with vacancy ratio in the range of 20 percent through 70 percent, preferably 20 to 60 percent and more preferably in the range of 30 percent through 50 percent. If the vacancy ratio is less than 20 percent, increase in sensitivity is insufficient, and if more than 70 percent anti-staining property has tendency to be poor. Thus a vacancy ratio less than 20% and more than 70% is undesirable.

A specific example at a method for controlling the anodic oxidation coating is using low current density and carrying out the anodic oxidation for a long time. Accordingly a large number of small vacancies are formed effectively resulting in an excellent low density coating. At the same time higher temperature and higher concentration of the electrolyte are known to have a tendency of increasing the diameter of the vacancies formed on the surface of the anode oxidation coating. Therefore this method may be used in combination with a sealing method described below to obtain a desired coating density. After anodic oxidation has been carried out, the density of the anodic oxidation coating which was formed may be made even lower by dissolving the micropores in acid or alkali. In addition, a person skilled in the art will be able to appropriately select a control method from known methods conventionally used.

In the above mentioned process, when coating with low density is required in order to satisfy condition (i), density of the coating is calculated by the following equation. Here the weight of the coating is obtained by, for example, Mason's method (the weight is obtained by dissolving the anodic oxidation coating with a mixture of chromic acid and phosphoric acid), and the thickness is obtained by measuring using scanning electron microscope).

density (kg/$m^3$)=(weight of coating in unit area)/(thickness of coating)

If the density of the coating obtained here is less than 1000 kg/$m^3$, strength of the coating small. This may adversely affect image recording ability and durability in printing. If the density is more than 3200 kg/$m^3$ enough thermal insulative property is not obtained and as a result the effect of increasing of sensitivity becomes poor.

When it is desired to obtain an anodic oxidation coating satisfying condition (ii) after controlling vacancy ratio and distribution density to thereby optimize the anodic oxidation condition, it may be further possible to treat the anodic oxidation coating with an aqueous solution of acids or alkalis in order to increase vacancy ratio.

This treatment consists of immersing the aluminum substrate coated with anodic oxidation coating in an aqueous solution of acids or alkalis and dissolving the anodic oxidation coating to 0.05 g/$m^2$ through less than 20 g/$m^2$, preferably 0.1 g/$m^2$ through 5 g/$m^2$.

The following treating condition is preferable in order to obtain above-mentioned dissolution amount. The specific conditions are as follows: when treatment is performed in acid aqueous solution it is preferable to use sulfuric acid or phosphoric acid or a mixture thereof; concentration in the range of 10 grams/liter through 500 grams/liter preferably 20 grams/liter through 100 grams/liter; temperature in the range of 10 degrees Celsius through 90 degrees Celsius preferably 40 degrees Celsius through 70 degrees Celsius; and a treating period of 10 seconds through 300 seconds preferably 30 seconds through 120 seconds. On the other hand, when treatment is performed in alkali aqueous solution it is preferable to use sodium hydroxide, potassium hydroxide, lithium hydroxide or a mixture thereof; pH value of the aqueous solution in the range of 11 through 13 preferably 11.5 through 12.5; temperature in the range of 10 degrees Celsius through 90 degrees Celsius preferably 30 degrees Celsius through 50 degrees Celsius; and a treating period of 5 seconds through 300 seconds preferably 10 seconds through 30 seconds. If treatment is performed under less restrictive conditions than those mentioned above dissolution will take longer resulting in inferior operation efficiency, and if performed under more restrictive conditions, the anodic oxidation coating is dissolved in an extremely short period making it practically impossible control the coating. Therefore conditions not within the above mentioned preferable range are not desirable.

Sealing of Anodic Oxide Coating: Controlling Process for surface Area and/or Vacancy Ratio It is desirable to perform a sealing process for controlling the surface area and/or vacancy ratio of the support after forming of the anodic oxide coating.

In the case where a coating with low density is required in order to satisfy condition (i), treatment is performed to increase the surface area of the support so as to make it 1 through 30 times as large as the apparent surface area after forming coating with density of 1000 kilograms/meter$^3$ through 3200 k/$m^3$. In the case of a plate of 100 millimeters×100 millimeters having only one side roughened and whose surface has been subjected to anodic oxidation, apparent surface area as used here is 10000 $mm^{2\ 2}$, and when both sides have been exposed to anodic oxidation surface apparent surface area is 20000 $mm^2$.

The most generally used method to control the surface area so that it is in a desired range is described in JP-A No. 4-176690 and Japanese Patent Application No. 10-106819 wherein sealing of the anode oxidation coating is performed using pressurized steam or hot water. Moreover any known sealing process can be used such as treatment by silicate, dichromate aqueous solution, nitrite aqueous solution, ammonium acetate, electrodeposition sealing, triethanolamine, barium carbonate and hot water containing an infinitesimal amount of phosphate. The detailed process of formation of the pore has different steps according to the method used. For electrodeposition sealing the coating is formed from the bottom of the pore and for steam sealing from the top of the pore. In either different method the sealing must result in a support in which a desired range of the surface area is sealed.

And in the case that coating is required which satisfies condition (ii), sealing is preferably performed to control the diameter of the micropore so that it is in the desired range. Sealing process here is performed such that only the top area is sealed, and except for this top area, vacancies remain in a cross sectional thickness direction of the anode oxidation coating.

For example, it is preferable to use the sealing process wherein sealing is performed from the upper portion of pores by pressurized steam or hot water as described in JP-A No. 4-176690 and JP-A No. 5-202496. Other than a steam sealing process it is also possible to use known process such as treatment by silicate, dichromate aqueous solution, nitrite aqueous solution, ammonium acetate, electrodeposition sealing, triethanolamine, barium carbonate and hot water containing an infinitesimal amount of phosphate.

The diameter of the micropore (vacancy) of anodic oxidation coating is preferably not more than 15 nanometers, and more preferably not more than 10 nanometers. If the diameter exceeds than the desired range, for example if it is not less than 20 nanometers anti-staining property in printing has a tendency of decreasing.

Any method is applicable for controlling surface area and vacancy ratio such that they are in the desired range. Examples of such method include; immersing in solutions, spraying, coating, vapor deposition, spattering, ion plating, thermal spraying and plating. There is no limitation in using any method providing the result is satisfactory.

Specific examples of treating process include methods used for coating the following layers; a layer comprising compounds having at least one amino group selected from the group of carboxylic group and salt thereof and sulfo group and salt thereof as described in JP-A No. 60-149491; a layer comprising compounds selected from the group of compounds having at least one amino group and at least one hydroxyl group or salt thereof as described in JP-A No. 60-232998; a layer comprising phosphate as described in JP-A No. 62-19494, and layer comprising polymers including at least one monomer unit with sulfo group as repeating unit in molecular as described in JP-A No. 59-101651.

In addition, a method may be used to form a layer comprising compound(s) selected from the following compounds; carboxymethyl cellulose, dextrin, Arabic gum, phosphonic acids having amino group such as 2-aminoethylphosphonic acid, organic phosphonic acids such as phenylphosphonic acid, naphthyl phosphonic acid, alkyl phosphonic acid, glycero phosphonic acid, methylene diphosphonic acid and ethylene diphosphonic acid wherein all these acids may have substituent, organic phosphoric acid ester of phenyl phosphoric acid, naphthyl phosphoric acid, alkyl phosphoric acid and as glycero phosphoric acid wherein all these esters here may have substituents, organic phosphinic acids such as phenyl phosphinic acid, naphthyl phosphinic acid, alkyl phosphinic acid and glycero phosphinic acid wherein all these acids here may have substituents, amino-acids such as glycine or β-alanine and hydrochlorides of amines having hydroxyl group such as hydrochloride of triethanolamine.

In sealing process silane coupler(s) having an unsaturated group may be applied. Example include: N-3-(acryloxy-2-hydroxypropyl)-3-aminopropylethoxysilane, (3-acryloxypropyl)dimethylmethoxysilane, (3-acryloxypropyl)methyldimethoxysilane, (3-acryloxypropyl)trimethoxysilane, 3-(N-allylamino)propylmethoxysilane, allyldimethoxysilane, allyltriethoxysilane, allyltrimethoxysilane, 3-butenyltriethoxysilane, 2-(chloromethyl)allyltrimethoxysilane, methacrylamidopropyltriethoxysilane, N-(3-methacryloxy-2-hydroxypropyl)-3-aminopropyltriethoxysilane, (methacryloxydimethyl)dimethylethoxysilane, methacryloxymethyltriethoxysilane, methacryloxymethyltrimethoxysilane, methacryloxypropyldimethylethoxysilane, methacryloxypropyldimethylmethoxysilane, methacryloxypropylmethyldiethoxysilane, methacryloxypropylmethyldimethoxysilane, methacryloxypropylmethyltriethoxysilane, methacryloxypropylmethyltrimethoxysilane, methacryloxypropyltris (methoxyethoxy)silane, methoxydimethylvinylsilane, 1-methoxy-3-(trimethylsiloxy)butadiene, styrylethyltrimethoxysilane, 3-(N-styrylmethyl-2-aminoethylamino)-propyltrimethoxysilane hydrochloride, vinyldimethylethoxysilane, vinyldiphenylethoxysilane, vinylmethyldiethoxysilane, vinylmethyldimethoxysilane, O-(vinyloxyethyl)-N-(triethoxysilylpropyl)urethane, vinyltriethoxysilane, vinyltrimethoxysilane, vinyltri-t-butoxysilane, vinyltriisopropoxysilane, vinyltriphenoxysilane, vinyltris(2-methoxyethoxy)silane and diallylaminopropylmethoxysilane. Of these silane couplers, coupler(s) having a methacryloyl group or an acryloyl group having quick reactivity with an unsaturated group is preferably used. However any of the couplers having vinyl group and/or allyl group with di-functional unsaturated group may be used.

Other than the coating methods mentioned above any methods selected from the following may be used; a sol-gel coating method described in JP-A No. 5-50779, coating with phosphonic acids described in JP-A No. 5-246171, a method wherein material for back-coating is coated as described in JP-A No. 6-234284, JP-A No. 6-191173, JP-A No. 6-230653, treating with phosphonic acids described in JP-A No. 6-262872, a coating method described in JP-A No. 6-297875, an anodic oxidation method described in JP-A No. 10-109480, a dipping method described in Japanese Patent Application No. 10-252078, Japanese Patent Application No. 10-253411.

Image Recording Layer

An image recording layer described below, may be formed if necessary on the aluminum support obtained in the present invention. There is no limitation in selecting the image recording layer used for the invention provided it is writable with infrared laser beam irradiation. A layer that is directly writable by irradiation with an infrared laser beam and in which solubility of the irradiated area of the layer to an alkali developer is changed is referred to as thermal type photosensitive layer.

Known directly laser-writable thermal type photosensitive layer for planographic printing plate may be used in the present invention; such a photosensitive layer or recording layer as described in JP-A No. 9-222737, JP-A No. 9-90610, JP-A No. 9-87245, JP-A No. 9-43845, JP-A No.7-306528, or in Japanese Patent Application No. 10-229099, Japanese Patent Application No. 11-240601 by the inventor of the present invention.

These kinds of thermal type photosensitive layers mentioned above include infrared absorbing agents, polymer(s) insoluble in water and soluble in alkaline water and other any optional elements. Positive type recording layer becomes soluble in water or alkaline water by decomposition of the bonds in polymer composing the layer. The decomposition is induced by the energy in a form of acid or heat generation because of light irradiation or heating. The decomposed soluble compound is removed by a developing process resulting in formation of a non image portion. Negative type recording layer becomes hardened resulting in formation of the image portion the hardening of compound to form recording layer is induced by radical or acid generation that become initiators or catalysts causing. The component of the recording layer to undergo a polymerization or cross-linking reaction resulting in hardening due to light irradiation or heating.

In the present invention water insoluble and alkaline water soluble polymers are used in the recording layer. These compounds are hereinafter referred to as simply "alkaline water soluble polymer".

Suitable polymers for the recording layer of the present invention preferably include homopolymers having an acidic group in its main chain and/or side chain. Copolymers of these or mixtures thereof are also preferably used.

Polymers having at least one of the following acidic groups shown below (1) through (6) in the main chain and/or in the side chain are preferable from the viewpoint of solubility in alkaline developer and the solubility controlling properties.

(1) phenol group (—Ar—OH)

(2) sulfonamide group ($—SO_2NH—R$)

(3) substituted sulfonamides group (hereinafter referred to as "active imide group") [$—SO_2NHCOR$, $—SO_2NHSO_2R$, $—CONHSO_2R$ ]

(4) carboxylic group ($—CO_2H$)

(5) sulfonic group ($—SO_3H$)

(6) phosphoric group ($—OPO_3H_2$)

In (1) through (6) above Ar represents di-functional aryl connecting group that may have a substituent, and R represents a hydrocarbon group that may have a substituent.

In the alkaline water soluble polymer having an acidic group selected from (1) through (6), an alkaline water soluble polymer comprising (1) a phenol group, (2) a sulfonamide group and (3) an active imide group are preferably used, and alkaline water soluble polymer comprising (1) a phenol group and (2) sulfonamide group are particularly preferable because of solubility in the alkaline developer, developing latitude and because coat strength is sufficient.

Examples of alkaline water soluble polymers selected from the groups (1) through (3) are shown as follows.

(1) Examples of an alkaline water soluble polymer having phenol group include novolac resins obtained by condensation of phenol and formaldehyde, m-cresol and formaldehyde, p-cresol and formaldehyde, cresol of m-/p-mixture and formaldehyde and phenol and cresol(any one of m-, p-, m- and p-mixture), and polycondensation polymer of pyrogallol and acetone. Moreover copolymers obtained by copolymerizing compounds having phenol group in the main chain may be used. Or copolymers obtained by copolymerizing compounds having phenol group in the side chain can be used.

From the view point of image recording ability the weight average molecular weight of alkaline water soluble polymer is preferably in the range of $5.0\times10^2$ through $2.0\times10^4$ and the number average molecular weight is preferably in the range of $2.0\times10^2$ through $1.0\times10^4$. And moreover these polymers may be used separately or two or more of them may be used in combination. When two or more polymers are used in combination, polycondensation polymer obtained from phenols having alkyl substituent having 3 through 8 carbons and formaldehyde such as polycondensation polymer of t-butylphenol and formaldehyde or a condensation polymer of octylphenol and formaldehyde may be used in combination as described in U.S. Pat. No. 4,123,279.

(2) As alkaline water soluble polymer having sulfonamide group, for example, a polymer wherein a least component unit derived from compounds with sulfonamide group is used as main component may be used. An example of the compound mentioned above is a compound having one or more sulfonamide group with at least one hydrogen atom bonded to nitrogen atom and one or more unsaturated polymerizable group respectively. In the examples described above a compound with low molecular weight and has acryloyl group, allyl group or vinyloxy group, and substituted or mono-substituted aminosulfonyl group or substituted sulfonylimino group in the same molecule as is shown below in general formulae 1 through 5 is particularly preferable.

general formula 1

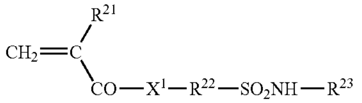

general formula 2

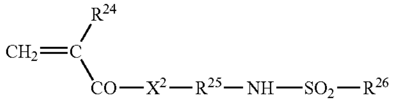

general formula 3

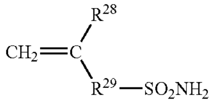

general formula 4

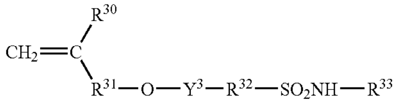

general formula 5

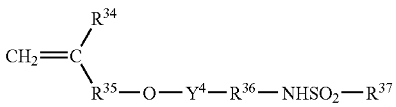

In the formulae $X^1$ and $X^2$ represent —O— or —$NR^{27}$— respectively. $R^{21}$ and $R^{24}$ represent a hydrogen atom or —$CH_3$; $R^{22}$, $R^{25}$, $R^{29}$, $R^{32}$ and $R^{36}$ represent respectively an alkylene group, a cycloalkylene group, an allylene group or an aralkylene group having 1 through 12 carbons and which may have substituent(s); $R^{23}$, $R^{27}$ and $R^{33}$ represent respectively a hydrogen atom or an alkyl group, a cycloalkyl group, an allyl group or an aralkyl group having 1 through 12 carbons and which may have substituent(s); $R^{26}$ and $R^{37}$ also represent respectively an alkyl group, a cycloalkyl group, an allyl group or an aralkyl group having 1 through 12 carbons and which may independently have single bonds or may have substituent(s); $R^{28}$, $R^{30}$ and $R^{34}$ represent hydrogen atom or —$CH_3$ respectively; $R^{31}$ and $R^{35}$ represent respectively a single bond or an alkylene group, a cycloalkylene group, an allylene group or an aralkylene group having 1 through 12 of carbon and which may have substituent(s); $Y^3$ and $Y^4$ represent single bond or —CO— respectively.

In the compounds represented by the general formulae 1 through 5, particularly m-aminosulfonylphenylmethacrylate, N-(p-aminosulfonylphenyl)methacrylamide and N-(p-aminosulfonylphenyl)acrylamide may be favorably used.

(3) The alkaline water soluble polymer having active imide group may be for example, a polymer wherein the least component unit derived from compounds with active imide groups is used as a main component.

An example of this type of compound is a compound that has one or more of the active imide groups shown in the formula below and one or more of the polymerizable unsaturated groups in the molecule.

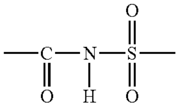

Specifically N-(p-toluenesulfonyl)methacrylamide and N-(p-toluenesulfonyl)acrylamide and others may be favorably used.

The least component unit having an acidic group selected from (1) through (6) composing alkaline water soluble polymer used for positive recording layer is not necessarily limited to only one type. A copolymer from two or more units having the same acidic group or two or more units having different acidic group may be used.

The copolymer mentioned above is obtained by known polymerization method such as graft copolymerization, block copolymerization and random copolymerization etc.

The content in the copolymer of the compound for copolymerization having acidic group selected from (1) through (6) is preferably not less than 10 mole percent, and more preferably not less than 20 mole percent. If it is less than 10 mole percent, there is tendency for the developing latitude to not increase sufficiently.

It is preferable for negative image recording material layer to use a polymer that has an aromatic cyclic hydrocarbon in a main chain, wherein the aromatic cyclic hydrocarbon is directly bonded with a hydroxy group or an alkoxy group. In light of sensitivity an alkoxy group with no more than 20 carbon atoms is preferable. The aromatic cyclic hydrocarbon benzene ring is preferably a naphthalene ring or anthracene ring because of availability. These aromatic cyclic hydrocarbon may have halogen group or cyano group other than hydroxy group or alkoxy group, but preferably does not have groups other than hydroxy group or alkoxy group in light of sensitivity.

The binder polymer preferably used in the present invention is a phenolic resin such as novolac resin or a polymer structural unit is represented by general formula (I) below.

general formula (I)

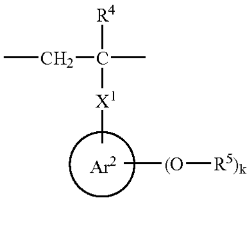

wherein $Ar^2$ represents a benzene ring, a naphthalene ring or an anthracene ring. $R^4$ represents a hydrogen atom or a methyl group. $R^5$ represents a hydrogen atom or an alkoxy group having 20 or less carbons. $X^1$ represents 2-valent connecting group having 0 through 20 carbon atoms and having single bond or at least one atom selected from C, H, N, O and S. k represents an integer of 1 through 4.

Examples ([BP-1] through [BP-6]) of structural units represented by general formula (I) which are preferably used in the present invention are shown below, but the present invention is not limited by these examples.

[BP-1]

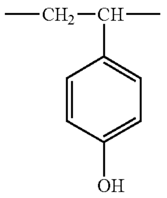

[BP-2]

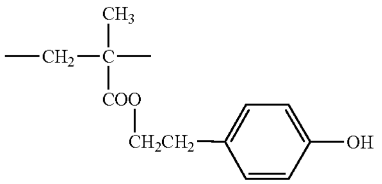

[BP-3]

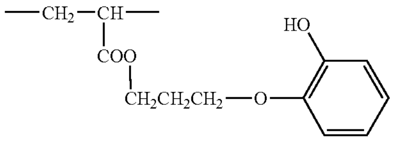

[BP-4]

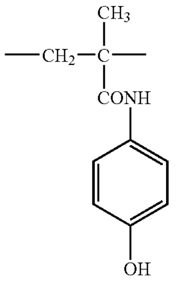

[BP-5]

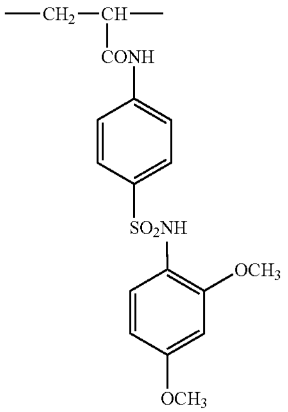

-continued

[BP-6]

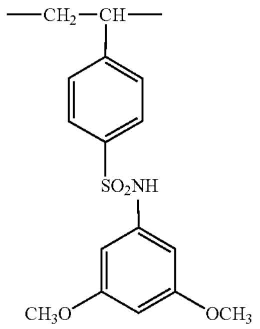

Polymers having these structural units are obtained by radical polymerization of corresponding monomers using conventional method.

Next a description of novolacs used in the present invention is given. The novolac resin preferably used in the present invention include phenol novolac, o-, m-, p-cresol novolacs and copolymers thereof and novolacs composed of phenols substituted by a halogen atom or an alkyl group etc.

The weight average molecular weight is preferably not less than 1000, and more preferably in the range of 2000 through 20000. The number average molecular weight is preferably not less than 1000, and more preferably in the range of 2000 through 15000. Polydispersity is preferably not less than 1, and more preferably in the range of 1.1 through 10.

The infrared absorbing agent contained in the recording layer of the present invention functions to convert infrared light to heat. Accordingly when the layer is scanned by laser beam the infrared absorbing agent induces photochemical reaction, and as a result solubility of the recording layer in the developer is substantially increased.

Infrared absorbing agent used in the present invention is a dye or pigment that effectively absorbs infrared light of wavelength in the range of 760 nanometer through 1200 nanometer. More preferably the dye or the pigment has an absorption peak between wavelengths of 760 nanometer through 1200 nanometer.

The dyes conventionally known to be available such as those described in "Guidebook for Dyestuff" (Senryo binran) published by The Society of Synthetic Organic Chemistry, Japan in 1970 may be used. Examples of the dye are as follows; metal complex azo dyes, pyrazolone azo dyes, naphthoquinone dyes, anthraquinone dyes, phthalocyanine dyes, carbonium dyes, quinonimine dyes, methine dyes, cyanine dyes, squarylium colorant, pyrylium salt and metal thiolate complex.

Pigments conventionally available in the market or described in Color Index, in "New Pigment Handbook" (Saisin Ganryo Binran) (by association of pigment technique in Japan, in 1977), in "New Pigment Application Technique" (Saishin Ganryo Ouyou Gijutsu) (by CMC, in 1986) and in "Technique in Printing Ink" (Insatsu Ink Gijutsu (by CMC, in 1984) may be used.

Any infrared absorbing agents may be used if they have photothermal conversion properties. Specifically, for example, those described in paragraph [0038] through [0050] of JP, 11-985,A are preferably used.

It is preferable to use about 0.01 through 30 weight percent of dye or pigment based on the amount of solid in recording layer coating solution.

Moreover anionic infrared absorbing agent described in Japanese Patent Application No. 10-237634 is also a preferable example.

A negative recording layer includes an acid generator, an acid cross-linker, a radical generator and a hardening compound in order to decrease solubility of the alkaline water soluble polymer in alkaline water. This acid releasing compound is decomposed by light or heat and as a result generates an acid that induces cross-linking reaction by a cross-linking agent resulting in hardening of binder polymer. And the radical releasing compound releases radical by light or heat inducing hardening reaction of hardening compound in the layer.

Any known additives may be used in combination in the recording layer of the present invention according to necessity.

These compounds are dissolved together in a suitable solvent to prepare a coating solution for the photosensitive layer. The solution then is coated on the aluminum support having a predetermined surface area mentioned above to obtain a planographic printing plate of the present invention.

The amount (solid) of the coating of the recording layer depends on the requirements for usage, and is kept in the range of 0.01 $g/m^2$ through 3.0 $g/m^2$. Any of the following coating methods may be adopted in the present invention; bar-coater coating, drum coating, spray coating, curtain coating, dip coating, air knife coating, blade coating and roll coating. Decrease of the amount of coating causes increase of apparent sensitivity, but at the same coating property of the photosensitive layer decreases.

EXAMPLES

While the invention will be described with reference to examples, the invention is not to be limited to these embodiments.

Example i-1 Through i-3

Preparation of Support (a) Example of the metal mainly composed of aluminum includes an alloy containing mainly aluminum combined respectively with Si:0.07 percent by weight, Fe:0.30 percent by weight, Cu:0.017 percent by weight, Mn:0.001 percent by weight, Mg:0.001 percent by weight, Zn:0.001 percent by weight, Ti:0.03 percent by weight and aluminum having inevitable impurity in the remaining portions are used to prepare hot metal. After melting and filtration, an ingot with a thickness of 500 millimeters and width of 1200 millimeters is obtained by DC foundry method. An average of 10 millimeter of the ingot surface is removed by machining, and subsequently heat is kept constant for about 5 hours at 550 degrees Celsius and then lowered to 400 degrees Celsius, the ingot is rolled by a hot rolling mill to obtain mill plate with thickness of 2.7 millimeter. After the mill plate obtained is annealed at 500 degrees Celsius using continuous annealing machine, it is cold-rolled to obtain an aluminum plate with a thickness of 0.24 millimeter. The following process is continuously performed using the aluminum plate after the aluminum plate obtained the width of 103 millimeter.

(b) An aluminum plate is etched by spray method with a sodium hydroxide concentration of 2.6 percent by weight, and containing an aluminum ion concentration of 6.5 percent by weight at a temperature of 70 degrees Celsius. The aluminum plate is dissolved to 7 $g/m^2$. Then the aluminum plate is washed by spraying with water.

(c) The aluminum plate is then treated with an aqueous solution of 1 percent by weight of nitric acid (containing 0.5 percent by weight of aluminum ion) for de-smutting and washed with water. The aqueous solution used here for de-smutting is waste water from the electrochemical roughening step that is performed using AC current in an aqueous solution of nitric acid.

Figure 2:
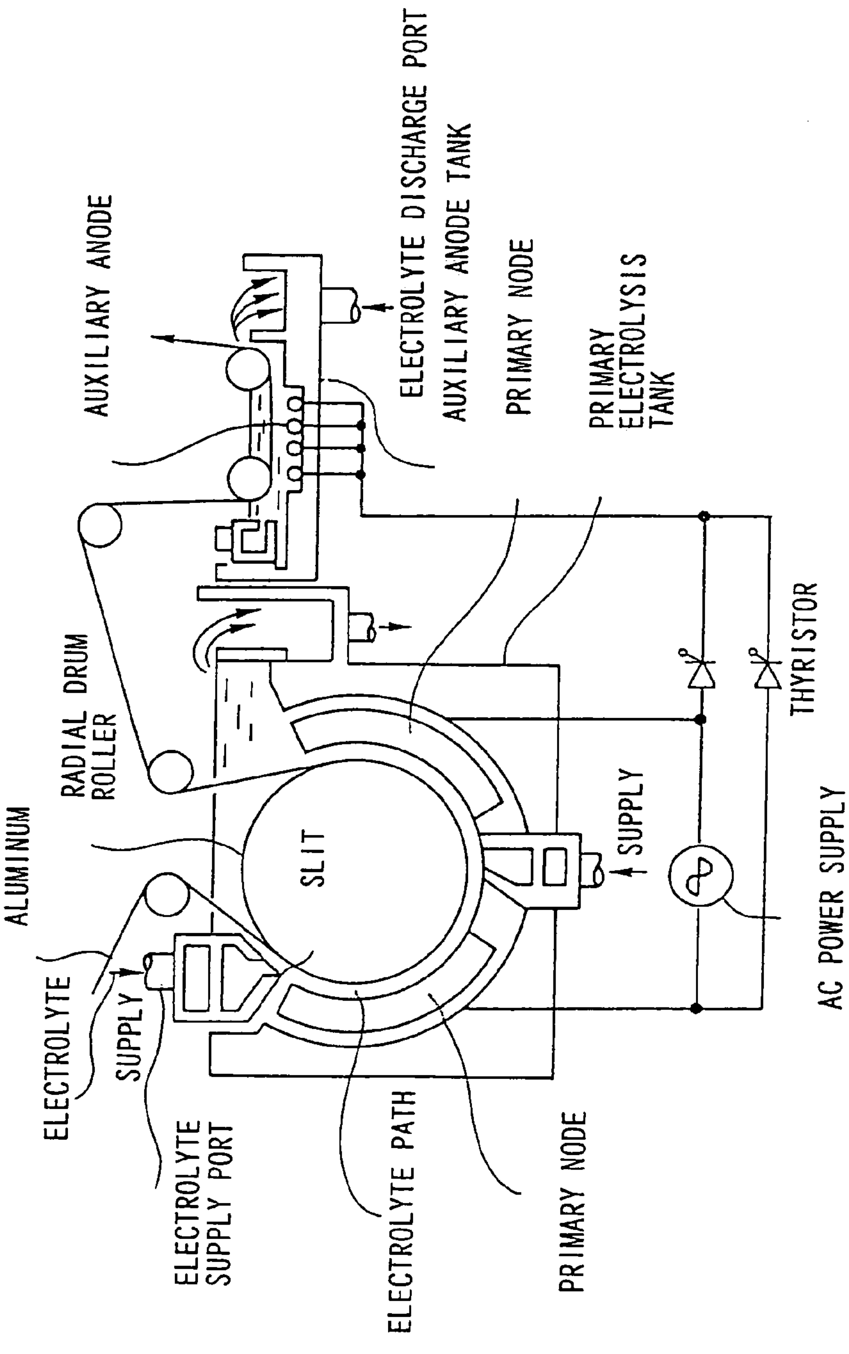
FIG. 2 is a block diagram showing an apparatus with a radial drum roller used in the process of electrochemical roughening of an aluminum support for a planographic printing plate in the present invention.

(d) Electrochemical roughening treatment is then continuously performed using AC current of 60 Hz in an electrolyte of an aqueous solution of 1 percent of nitric acid (containing 0.5 percent by weight of aluminum ion and 0.007 percent by weight of ammonium ion) at 50 degrees Celsius. The electrochemical roughening treatment is performed using a carbon electrode and AC current that has a waveform shown in FIG. 1, whose period TP which is the period necessary for current value to reach from zero to the peak is 2 millisecond, the duty ratio is 1:1 and trapezoidal short wave form was used. Ferrite was used in supporting anode. Two electric cells shown in FIG. 2 are employed.

Electric current density is 30 $A/dm^2$ at the peak and total quantity of electricity when aluminum plate is used as an anode is 270 $C/dm^2$. Five percent of current is shunted to a supporting anode.

Subsequently the treated aluminum plate is washed with water by being sprayed.

(e) The aluminum plate then is etched by being sprayed with caustic soda having a concentration of 26 percent by weight, and containing an aluminum ion concentration of 6.5 percent by weight and at temperature of 70 degree Celsius thereby dissolving 0.2 $g/m^2$ of aluminum plate. By this process, a smut component mainly comprising aluminum hydroxide that is formed during the electrochemical roughening by the AC current is removed and edge of a pit formed is dissolved to be made smooth. It washed with water by spraying afterwards.

(f) De-smutting treatment is performed by spraying 25 percent by weight of an aqueous solution of sulfuric acid (containing 0.5 percent by weight of aluminum ion) at 600, and the plate is washed with water by being sprayed. The aluminum plate obtained here is referred to as substrate A.

(g) The substrate is subjected to anodic oxidation in a conveyer oxidation apparatus with sulfuric acid having a concentration of 450 grams/liter (containing 0.5 percent by weight of aluminum ion), at a temperature of 50 degree Celsius, with a current density of 2 $A/dm^2$ for 200 seconds, and the substrate is then washed with water by being sprayed. The anodic oxidation is carried out under varied conditions as shown in Table 1.

TABLE 1

| | Anodic oxidation condition | | | |
|---|---|---|---|---|
| support | current density ($A/dm^2$) | treating period (sec) | treating temperature (° C.) | concentration of electrolyte (g/l) |
| B-1 | 2 | 200 | 50 | 450 |
| B-2 | 30 | 15 | 50 | 450 |
| B-3 | 25 | 10 | 50 | 100 |

The density of the low density coating formed here is obtained from a coating thickness derived by measuring weight/thickness for three samples, using Mason's method (the anodic oxidation coating weight by dissolving a mixture of chromic acid and phosphoric acid) and by observing a cross-section with a scanning electron microscope respectively. The measurement is repeated at 10 points of each sample. The density, weight/thickness, ($kg/m^3$) is obtained from resulting 30 points of measured value. Result is shown Table 2 below.

(h) In the next step, steam sealing treatment is carried out using the sealing apparatus described in Japanese Patent No. 2791730 under the conditions of 100 degrees Celsius, and 1 atm for 10 seconds to obtain sealing ratio=(((specific surface of substrate before sealing)−(specific surface of substrate after sealing))/(specific surface of substrate before sealing)) of 90 percent.

Here specific surface is (actually measured surface area)/(apparent surface area)

Actual surface area is obtained based on the amount of a mixture helium gas and 0.1 percent of krypton physically absorbed using a cantasorb manufactured by YUASA Ionics Co., Ltd.

(i) The substrate is then treated with a 1 percent by weight aqueous solution of sodium silicate No. 3 for 10 seconds and followed by washing by spraying. The substrates are referred to as substrate B-1 through a substrate B-3 according to the respective anodic oxidation conditions.

Application of Basecoat

The substrates B-1 through B-3 are coated by base coating solution and then dried for 15 seconds at 80 degrees Celsius. The coating amount of basecoat after drying is 15 $mg/m^2$.

Composition of the base coating solution is as follows.

| | |
|---|---|
| random copolymer described below | 0.3 gram |
| methanol | 100 grams |
| water | 1 gram |

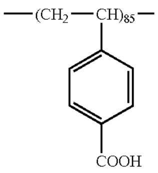

(A)

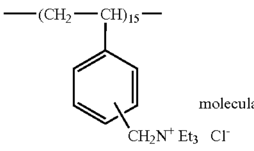

molecular weight: 2800

(B)

random copolymer polymerized with the mixture ratio of the structure units (A):(B) = 85:15

In the next step, coating solution 1 for a photosensitive layer is prepared. The photosensitive layer solution 1 is applied on the base-coated substrate so that the coating amount is 1.0 $g/m^2$, thereby obtaining a planographic printing plates of examples i-1 through i-3.

The composition of the coating solution 1 for a photosensitive layer is as follows.

| | |
|---|---|
| Capric acid | 0.03 gram |
| specific copolymer 1 described below | 0.75 gram |
| m-, p-cresol novolac (m/p ratio = 6/4, weight average molecular weight 3500, unreacted cresol 0.5 percent by weight contained) | 0.25 gram |
| p-toluenesulfonic acid | 0.003 gram |
| tetrahydrophthalic acid anhydride | 0.03 gram |
| cyanine dye A (structure described below) | 0.017 gram |
| dye in which counter ion of victoria pure blue BOH is modified by 1-naphthalenesulfonic acid | 0.015 gram |
| fluoro-based surfactant (trade-name: MEGAFACK F-177, by DAINIPPON INK AND CHEMICALS, Inc.,) | 0.05 gram |
| γ-butyrolactone | 10 grams |
| methyethylketone | 10 grams |
| 1-methoxy-2-propanol | 1 gram |

-continued

Cyanine dye A

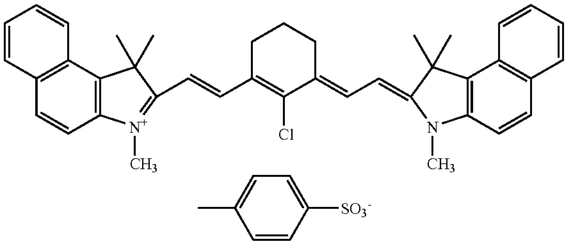

Preparation of Specific Copolymer 1

In a 500 milliliters three-neck flask with stirrer, condenser tube and dropping funnel, 31.0 grams (0.36 mole) of methacrylic acid, 39.19 grams (0.36 mole) of ethyl chloroformate and 200 milliliters of acetonitrile are introduced while being stirred and cooled in an ice and water bath. In to the mixture described above, 36.49grams (0.36mole) of triethylamine is dropped in by a dropping funnel over about 1 hour. After dropping is complete, the water bath is removed from the flask and the mixture is stirred at room temperature for 30 minutes.

Into the mixture 51.7 grams of p-aminobenzenesulfonamide (0.30 mole) is added and the mixture is stirred at 70 degrees Celsius in an oil bath for 1 hour. After the reaction is finished, the mixture is poured into 1 liter of water while being stirred. The mixture obtained is stirred for 30 minutes. The mixture is filtered and the sludge is then mixed with water to obtain slurry. The slurry is filtered and the resultant solid is dried obtaining white solid of N-(p-aminosulfonylphenyl)methacrylamide (yielded 46.9 grams).

In a 20 milliliters three-neck flask with stirrer, condenser tube and dropping funnel, 4.61 gram of N-(p-aminosulfonylphenyl)methacrylamide (0.0192 mole), 2.94 gram of ethylmethacrylate (0.0258 mole), 0.80 gram of acrylonitrile (0.015 mole) and 20 grams of N,N-dimethylacetamide are introduced. The mixture is stirred while being heated to 65 degrees Celsius in a water bath. To the mixture, 0.15 gram of a polymerization initiator −65 (trade name, product of Wako Pure Chemical Industries, Ltd.) is added and the mixture is maintained at "V−65" degrees Celsius under nitrogen flow kept while being stirred. Into the reaction mixture, the mixture of 4.61 gram of N-(p-aminosulfonylphenyl)methacrylamide, 2.94 gram of ethylmethacrylate, 0.80 gram of acrylonitrile, N,N-dimethylacetamide and 0.15 gram of a polymerization initiator −65 is further added by dropping for 2 hours. After dropping is completed, the mixture is stirred at 65 degrees Celsius for 2 hours. After the reaction ended, 40 grams of methanol is added into the mixture and cooled. The mixture obtained is then poured into 2 liters of water with while being stirring stirred and the sludge is removed by filtering and dried to obtain 15 grams of white solid. Weight average molecular weight of the specific copolymer 1 is determined measured using the gel permeation chromatography method. The value was 53000 (with polystyrene being the reference).

Evaluation of Sensitivity

The planographic printing plate obtained as mentioned above is exposed at a main operating speed of 5 m/sec to laser beam using semiconductor laser of output of 500 milliwatts, wavelength of 830 nanometers, and beam diameter of 17 micrometers ($1/e^2$). The exposed plate is developed using PS Processor 900 NP developing machine (trade name, by FUJI PHOTO FILM CO., LTD.) and developer LH-DP for PS (trade name, by FUJI PHOTO FILM CO., LTD.) diluted with water (developer:water=1:7.8) under the condition of specific conductance of 45 ms/centimeter.

After image-formation described above, a positive type erasing liquid RP-1S (trade name, FUJI PHOTO FILM CO., LTD.) is introduced on solid image portion for 1 minute at 25 degree Celsius. Then the plate is washed with water. The difference in the amount of residual binders between the area which has been washed and erased, and the non image portion of the developing process is measured and a difference of due to diffuse reflection of 280 nanometer was obtained. This difference is referred to as residual film. The minimum amount of energy of the plate surface, which is the amount immediately before the residual film amount increases rapidly is referred to as sensitivity. The result is shown in Table 2.

Evaluation of Anti-Staining Property

After printing of 100 sheets of paper is performed with the planographic printing plate thus obtained using printing machine SOR-M (trade name, by Heidelberg Co., Ltd.), printing is stopped and the machine is left for 30 minutes. After 30 minutes printing is started again to print 100 sheets of paper. Removability of ink from non image portion is evaluated based on the standard as follows.

○: ink removal is quick(excellent in anti-staining property)

Δ: ink removal is a little slow but not as slow as X

X: ink removal is slow (poor in anti-staining property)

The result is shown in Table 2.

Example i-4

The process of manufacturing substrate is that same as that for obtaining substrate B-3 in Example i-3, except that the sealing treatment is not carried out. The substrate obtained in the same manner as Example i-1 is referred to as Example i-4. The same evaluation is carried out and the result is shown in Table 2.

Example i-5

In the process of manufacturing substrate B-3 in Example i-3, a low density coating is formed by spattering substrate A in a spattering apparatus with $SiO_2$ as the target material under the conditions of 5 millitorr of Ar as the atmospheric gas and a Rf of 1 kilowatt for 27 minutes. The same process is performed to obtain a planographic printing plate i-5 except that anodic oxidation process is not performed. The same evaluation is carried out and the result is shown in Table 2.

Comparative Example i-1

A coating is formed by spattering substrate A in a spattering apparatus with $Al_2O_3$ as the target material under the conditions of 5 millitorr of Ar as the atmospheric gas and a Rf of 1 kilowatt for 27 minutes. The same process as in Example i-4 is performed to obtain planographic printing plate except that anodic oxidation process is not carried out. The planographic printing plate obtained in the same manner as Example i-1 is referred to as Comparative example i-1. The same evaluation as Example i-1 is carried to obtain a coating density of 3900 $kg/m^3$. The results of other evaluations are shown in Table 2.

Comparative Example i-2

The same process is performed as in Example i-4 except that anodic oxidation is carried out on substrate A with an aqueous solution of sulfuric acid having a concentration of 100 grams/liter (containing 0.5 percent by weight of aluminum ion), at a temperature of 50 degrees Celsius and at a current density of 30 $A/dm^2$. The planographic printing plate obtained is referred to as Comparative example i-2. The same evaluation as Example i-1 is carried out to obtain a coating density of 3300 $km/m^3$. A planographic printing plate was thereby obtained. Results of other evaluations are shown in Table 2.

Comparative Example i-3

The planographic printing plate of comparative example i-3 as manufactured by same process as that for obtaining substrate manufacturing substrate B-1 in Example i-1, except that temperature of electrolysis is set at 70 degrees Celsius. The same evaluation as Example i-1 is carried out to obtain coating density of 900 $kg/m^3$. The results of other evaluations are shown in Table 2.

TABLE 2

| | method of formation of coating | hydrophilic layer | density ($kg/m^3$) | sealing process | Sensitivity ($mJ/cm^2$) | anti-staining property |
|---|---|---|---|---|---|---|
| Example i-1 | anodic oxidation | aluminum oxide | 1050 | With | 60 | ○ |
| Example i-2 | anodic oxidation | aluminum oxide | 2300 | With | 80 | ◎ |
| Example i-3 | anodic oxidation | aluminum oxide | 3150 | with | 90 | ◎ |
| Example i-4 | anodic oxidation | aluminum oxide | 3150 | without | 100 | ○ |
| Example i-5 | spattering | silicon dioxide | 2190 | without | 80 | ○ |
| Comparative Example i-1 | spattering | aluminum oxide | 3900 | without | 180 | ○ |
| Comparative Example i-2 | anodic oxidation | aluminum oxide | 3300 | Without | 150 | ○ |
| Comparative Example i-3 | anodic oxidation | aluminum oxide | 900 | With | 60 | x |

As is apparent in Table 2 the planographic printing plate of the present invention that uses a support formed of a coating of a predetermined density on the surface of aluminum substrate, has excellent sensitivity and at the same time gives printed matter with excellent quality and which do not have stains.

On the other hand if the density of the coating is too high, sensitivity becomes inferior because of decreased thermal insulative property of support as in Comparative examples i-1 and i-2. And if the density is too low, as it is in Comparative example 3, though sensitivity is excellent the printed matter becomes stained.

Example ii-1

Preparation of Support

The same process is performed as process (a) through (i) except that in the process (g) anodic oxidation process is carried out on substrate A with an aqueous solution of sulphuric acid having a concentration of 170 grams/liter (containing 0.5 percent by weight of aluminum ion), at temperature of 40 degrees Celsius, at current density of 30 $A/dm^2$ and for 20 seconds. Substrate D-1 is obtained.

Application of a Basecoat

A basecoat is applied on the substrate D-1 mentioned above and dried at 80 degree for 15 seconds. The amount of the basecoat is 15 $mg/m^2$ after drying.

In the next step, the above mentioned solution for a photosensitive layer is prepared. The solution is applied on the base coated substrate such that the coating amount is 1.0 $g/m^2$. The planographic printing plate of example ii-1 is thereby obtained.

The planographic printing plate obtained is developed as in Example i-1.

Measurement of Vacancy Ratio vacancy ratio of the anodic oxidation coating is obtained in the equation below.

$$\text{vacancy ratio (percent)}=(1-(\text{density of anodic oxide coating})/3.98)\times 100$$

wherein density of anodic oxidation coating ($g/cm^3$)=(weight of anodic oxidation coating per unit area)/(thickness of anodic oxide coating). Here 3.98 is the density of aluminum according to Handbook of Chemistry (Kagaku Binran).

The weight of oxide coating per unit area is obtained as follows; after non image portion after development is cut to a desired size and dissolved by Mason's liquid comprising chromic acid/phosphoric acid and the weight of the oxide coating is calculated from loss. Thickness of anodic oxidation coating is obtained as follows; measurement is performed at 50 points of the cross-section of the non-image portion area of the anodic oxidation coating after development by are viewed with a scanning electron microscope T20 (by JAPAN ELECTRON OPTICS LABORATORY CO., LTD.) and measurement is performed at 50 points. Average value is calculated from the 50 data values obtained. Results obtained are shown in Table 3.

Measurement of Diameter of Micropores

The diameter of the micropores (vacancies) of the anodic oxidation coating of the non image portion after development is obtained from a SEM photograph using a scanning electron microscope S-900 (trade name, by HITACHI Ltd.) under the conditions of acceleration voltage of 12 kilovolts, no vapor deposition and magnification at 150000. The diameter is calculated by averaging the values at 50 randomly selected points. Results obtained are shown in Table 3.

Measurement of Contact Angle

After development, the non image portion is cut to a desired size and pure water is dropped onto the surface. After 30 seconds, the contact angle between water and the surface of the printing plate (non image portion) is measured. This measurement is repeated 5 times and the average is calculated. The average value represents contact angle. Results obtained are shown in Table 3.

Evaluation of Sensitivity

After forming of an image as described above, concentration in non image portion is measured using Macbeth densitometer. The energy of the plate immediately before concentration begins to increase rapidly is defined as sensitivity. Results obtained are shown in Table 3.

Evaluation of Anti-Staining Property

The same developing process as is described above is performed except that FP-2W (trade name, by FUJI PHOTO FILM CO., LTD.) is used as finisher solution.

The developed planographic printing plate is placed in printing machine SOR-M (trade name, Heidelberg Co., Ltd.). Ink is introduced on the entire printing surface and then water and paper feeds are started. The ink corresponding to the non image portion is removed. The amount of paper loss until non image portion having no stain on the printed matter is obtained is defined as anti-staining property of printing. The lower the amount of paper loss, the better anti-staining property. Results obtained are shown in Table 3.

TABLE 3

| | vacancy ratio | diameter of micropore (mm) | contact angle after development | sensitivity | anti-staining property (sheet) |
|---|---|---|---|---|---|
| Example ii-1 | 25% | 4 | spread and wet | 120 | 9 |
| Example ii-2 | 50% | 8 | spread and wet | 100 | 10 |
| Example ii-3 | 70% | 15 | spread and wet | 90 | 12 |
| Comparative Example ii-i | 15% | 8 | spread and wet | 150 | 10 |
| Comparative Example ii-2 | 50% | 20 | spread and wet | 120 | 30 |
| Comparative Example ii-3 | 50% | 8 | 30 degrees | 100 | 40 |
| Comparative Example ii-4 | 80% | 15 | spread and wet | 90 | 30 |

Example ii-2

The planographic printing plate of Example ii-2 is manufactured by the same process as that of Example ii-1 for obtaining substrate D-2 except that after the substrate is immersed in an aqueous solution of sodium hydroxide with a pH of 13 at 30 degrees Celsius for 45 seconds it is immersed in an aqueous solution of NaF having a concentration of 0.1 percent by weight and of $NaH_2PO_4$ having a concentration of 10 percent by weight at 100 degree Celsius for 1 minute instead of carrying out a steam sealing treatment. The same evaluation as in Example ii-1 is performed, and the results are shown in Table 3.

Example ii-3

The planographic printing plate of Example ii-3 is manufactured by the same process as that of Example ii-2 for obtaining a substrate D-2 except that the anodic oxidation is carried out with an aqueous solution of oxalic acid having a concentration of 50 percent by weight at 30 degrees Celsius and for 2 minutes, and that that the substrate is immersed in an aqueous solution of sodium hydroxide with pH of 13 at 50 degree Celsius for 2 minutes. The same evaluation as in Example ii-1 is performed and the results are shown in Table 3.

Comparative Example ii-1

The same process as the process of manufacturing substrate D-1 in Example ii-1 is performed for obtaining a planographic printing plate of Comparative example ii-1 except that the anodic oxidation is carried out with an aqueous solution of sulfuric acid having a concentration of 100 grams/liter, with a current density of 20 A/$dm^2$ for 30 seconds. The same evaluation as in Example ii-1 is performed to and the results are shown in Table 3.

Comparative Example ii-2

The same process as the process of manufacturing substrate D-2 in Example ii-1 is performed in order to obtain planographic printing plate of Comparative example of ii-2 except that immersion treatment of aqueous solution of NaF and $NaH_2PO_4$ are not applied. The same evaluation as in Example ii-1 is performed and the results are shown in Table 3.

Comparative Example ii-3

The same process as the process of manufacturing substrate D-2 in Example ii-2 is performed for obtaining a planographic printing plate of Comparative example of ii-3 except that instead of immersion in an aqueous solution of NaF and $NaH_2PO_4$ the substrate is immersed in 1 percent by weight aqueous solution of barium sulfate at 95 degree Celsius for 2 minutes. The same evaluation as in Example ii-1 is performed and the results are shown in Table 3.

Comparative Example ii-4

The same process as in Example ii-3 is performed to obtain planographic printing plate of Comparative example of ii-4 except that the immersion period in aqueous solution of sodium hydroxide is changed from 2 minutes to 3 minutes. The same evaluation as in Example ii-1 is performed and the results are shown in Table 3.

As is apparent from Table 3, a planographic printing plate of the present invention using a support having a coating with a predetermined vacancy ratio and predetermined physical properties on the surface of aluminum substrate has excellent sensitivity and at the same time has excellent anti-staining property.

On the other hand, as in Comparative example ii-1, in which the vacancy ratio is excessively low, the thermal insulative property becomes insufficient resulting in a decrease of sensitivity. Moreover, with an excessively high vacancy ratio as in Comparative example ii-4, though excellent sensitivity is obtained, anti-staining property is inferior. And even though vacancy ratio of the formed coating is in the scope of the present invention in the case that diameter of micropore and contact angle is out of the range of the present invention as is in Comparative examples ii-2 and ii-3, anti-staining properties are inferior.

The planographic printing plate on the present invention is capable of direct recording from digital data of a computer using an infrared laser and at the same time provides printed matter with high quality and without staining in the non image portion.

What is claimed is:

1. A planographic printing plate comprising: a recording layer writable by exposure to an infrared laser, said recording layer provided on a support and comprising an infrared absorbing agent and a polymer insoluble in water and soluble in alkaline water, the support including an aluminum substrate comprising a roughened surface including an inorganic oxidation coating disposed thereon, with the density of said inorganic oxidation coating being from 1000 to 3200 kilograms/$m^3$.

2. The planographic printing plate of claim 1, wherein the support further comprises a sealing treatment applied on the inorganic oxidation coating.

3. The planographic printing plate of claim 2, wherein the inorganic oxidation coating has a surface area weight of 0.5 g/$m^2$ to 20 g/$m^2$.

4. The planographic printing plate of claim 3, wherein the recording layer comprises a negative recording layer, the negative recording layer including an infrared absorbing agent, compounds that release an acid or radical by heat, and compounds that form crosslinks or polymerize due to the acid or radical.

5. The planographic printing plate of claim 3, wherein the recording layer comprises a positive recording layer, the positive recording layer including an infrared absorbing agent and compounds that become soluble in an alkaline aqueous solution by bonds thereof decomposing by heat.

6. The planographic printing plate of claim 2, wherein the recording layer comprises a negative recording layer, the negative recording layer including an infrared absorbing agent, compounds that release an acid or radical by heat, and compounds that form crosslinks or polymerize due to the acid or radical.

7. The planographic printing plate of claim 2, wherein the recording layer comprises a positive recording layer, the positive recording layer including compounds an infrared absorbing agent and compounds that become soluble in an alkaline aqueous solution by bonds thereof decomposing by heat.

8. The planographic printing plate of claim 1, wherein the inorganic oxidation coating has a surface area weight of 0.5 g/$m^2$ to 20 g/$m^2$.

9. The planographic printing plate of claim 8, wherein the recording layer comprises a negative recording layer, the negative recording layer including an infrared absorbing agent, compounds that release an acid or radical by heat, and compounds that form crosslinks or polymerize due to the acid or radical.

10. The planographic printing plate of claim 8, wherein the recording layer comprises a positive recording layer, the positive recording layer including an infrared absorbing agent and compounds that become soluble in an alkaline aqueous solution by bonds thereof decomposing by heat.

11. The planographic printing plate of claim 1, wherein the recording layer comprises a negative recording layer, the negative recording layer including an infrared absorbing agent, compounds that release an acid or radical by heat, and compounds that form crosslinks or polymerize due to the acid or radical.

12. The planographic printing plate of claim 1, wherein the recording layer comprises a positive recording layer, the positive recording layer including an infrared absorbing agent and compounds that become soluble in an alkaline aqueous solution by bonds thereof decomposing by heat.

* * * * *